United States Patent
Tanaka et al.

[19]

[11] Patent Number: 6,149,010
[45] Date of Patent: Nov. 21, 2000

[54] CARRIER FOR ELECTRONIC PARTS

[75] Inventors: Katsuhiko Tanaka, Iiyama; Yukio Ando; Yuuki Kanazawa, both of Kawasaki, all of Japan

[73] Assignees: Fujitsu Takamisa Component Limited, Tokyo; Fujitsu Limited, Kawasaki, both of Japan

[21] Appl. No.: 09/413,370

[22] Filed: Oct. 6, 1999

[30] Foreign Application Priority Data

Oct. 12, 1998 [JP] Japan .................................. 10-289753

[51] Int. Cl.⁷ .................................................. B65D 85/90
[52] U.S. Cl. ............................................ 206/714; 206/725
[58] Field of Search ................... 206/713–717, 206/725

[56] References Cited

U.S. PATENT DOCUMENTS

| | | | |
|---|---|---|---|
| 4,354,337 | 10/1982 | Mori et al. | 53/559 |
| 4,415,765 | 11/1983 | Iwasa et al. | 206/715 |
| 4,438,847 | 3/1984 | Fritz et al. | 206/716 |
| 5,312,015 | 5/1994 | Geizer | 206/714 |
| 5,361,901 | 11/1994 | Schenz et al. | 206/714 |
| 5,769,236 | 6/1998 | Maruyuma et al. | 206/714 |
| 5,772,038 | 6/1998 | Murata et al. | 206/725 |
| 5,992,639 | 11/1999 | Naito et al. | 206/714 |

FOREIGN PATENT DOCUMENTS

| | | |
|---|---|---|
| 7-23172 | 3/1995 | Japan . |
| 2-599010 | 1/1997 | Japan . |

*Primary Examiner*—Jim Foster
*Attorney, Agent, or Firm*—Staas & Halsey LLP

[57] ABSTRACT

The carrier including a plurality of storage sections for individually accommodating electronic parts and a plurality of connecting sections for connecting the adjacent storage sections with each other. Each storage section is provided with a bottom wall and a side wall for defining a recess, and a support section for supporting the electronic part. The support section includes one rib continuously extending on the bottom wall along a generally rectangular profile, and a plurality of columnar projections projecting from the bottom wall to a height generally identical to one another and lower than a height of the rib. The bottom wall includes a first surface extending between the side wall and the rib to define a first region of the recess, and a second surface extending inside the rib to define a second region of the recess shallower than the first region. The columnar projections are arranged in a distributed manner on the second surface of the bottom wall. The bottom wall is locally thickened at portions corresponding to the rib and the columnar projections.

8 Claims, 9 Drawing Sheets

CARRIER FOR ELECTRONIC PARTS

BACKGROUND OF THE INVENTION

1. Field of the Invention

The present invention relates to techniques for storage or handling of electronic parts and, more particularly, to a carrier used for carrying and storing surface-mount type electronic parts, such as surface-mount packages.

2. Description of the Related Art

Conventionally, for surface-mount electronic parts such as surface-mount IC or LSI packages, an electronic part provided with a molded body and a plurality of leads extending from the body is usually carried and stored in such a condition as to be accommodated in an exclusive container or carrier, to eliminate dust accumulation, lead damage, short circuits, and so on. The known structure of the carrier is, e.g., a tray (FIG. 1) or a carrier tape (FIG. 2).

Figure 1:
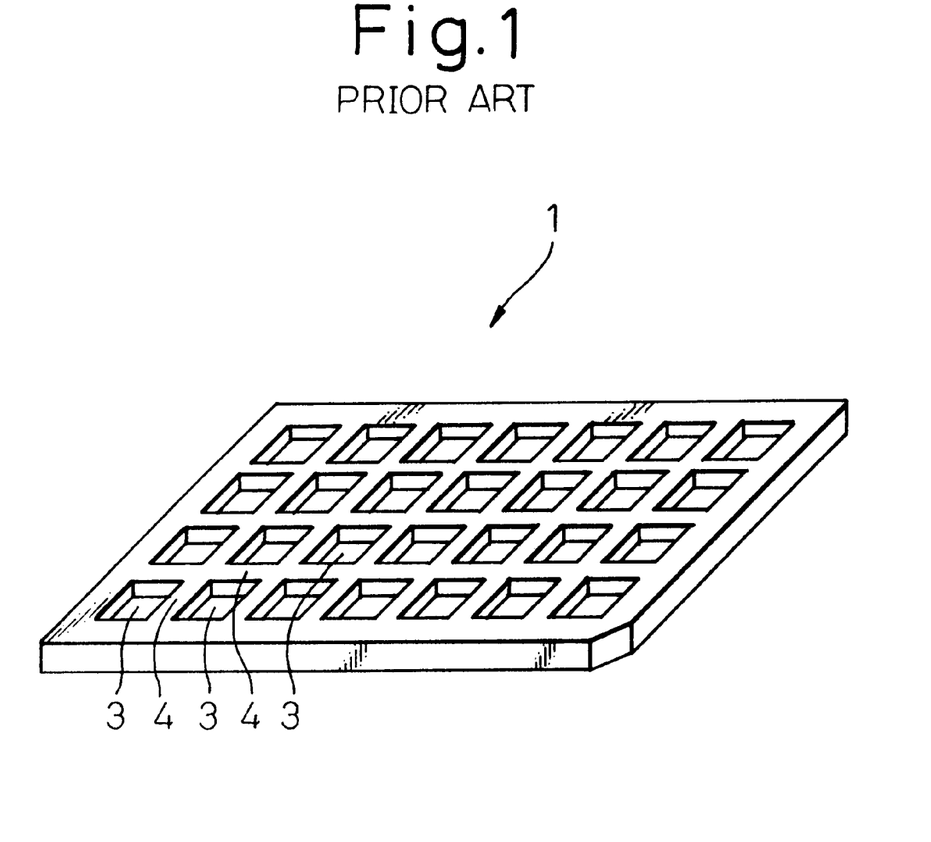
FIG. 1 is a schematic perspective view of one type of a conventional carrier for electronic parts.

As shown in FIG. 1, the conventional tray 1 includes a plurality of storage sections 3 defining recesses for individually receiving electronic parts (not shown) in a regular arrangement as, e.g., a matrix. A manufacturer of electronic parts ships the tray 1 with the electronic parts being accommodated in the storage sections 3. Then, a user of electronic parts takes out the electronic parts from the respective storage sections 3 of the tray 1 by using, e.g., an automatic mounting machine, and mounts them on circuit boards.

Figure 2:
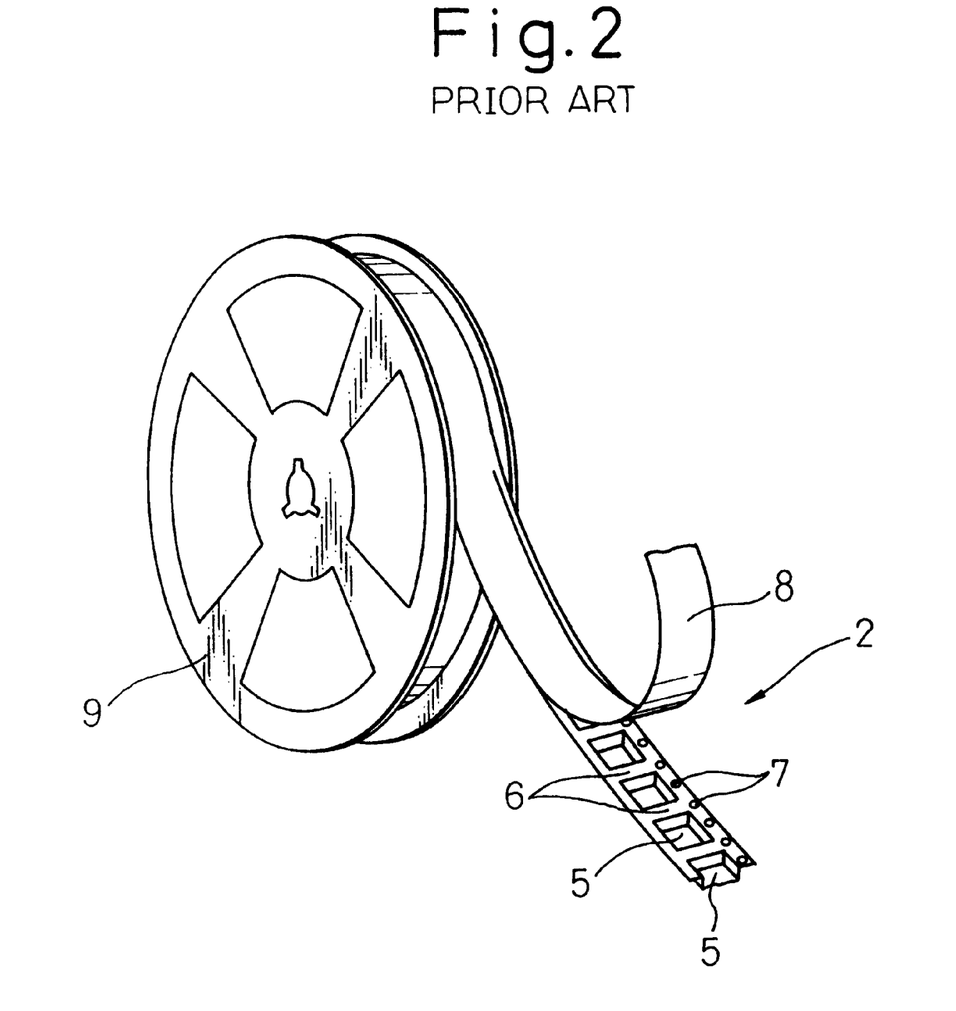
FIG. 2 is a schematic perspective view of another type of a conventional carrier for electronic parts.

On the other hand, as shown in FIG. 2, the conventional carrier tape 2 includes a plurality of storage sections 5 defining recesses for individually receiving electronic parts (not shown) in a regular arrangement along a longitudinal line. The adjacent storage sections 5 are connected through a connecting section 6 with each other, and a number of sprocket holes 7 are provided along one side edge of the tape to penetrate through a tape portion near the storage sections 5. A manufacturer of electronic parts usually ships the carrier tape 2 rolled on a reel 9 with the electronic parts being accommodated in the storage sections 5 and with a cover film 8 being attached to the tape to cover all the storage sections 5. Then, a user of electronic parts unrolls the carrier tape 2 from the reel 9 by using an automatic mounting machine, peels or removes the cover film 8, sequentially takes out the electronic parts from the respective storage sections 3 while the tape 2 being progressively fed, and mounts the electronic parts on circuit boards. This constitution has an advantage in that the time required for an automatic mounting process can be significantly shortened in comparison with the above-mentioned tray in which the electronic parts are distributed on one plane and are taken out one by one for a mounting operation.

In the above-described conventional carriers for electronic parts, a problem has been arisen in which the electronic parts are moved in the corresponding storage sections during carrying and storing, which results in a lead damage and/or a difficulty in smoothly taking out the electronic parts by the automatic mounting machine. To solve this problem, the solution has been provided wherein a support section is formed inside each storage section of the carrier for securely supporting the electronic part in a predetermined position therein.

For example, the publication of Japanese Patent No. 2599010 discloses a carrier tape which is provided on the bottom walls of storage sections with projections for supporting electronic parts. The projections of each storage section are formed as four ribs arranged along four sides of a rectangular profile in a plan view on the bottom wall. Each rib is provided with a support surface for supporting the molded body of the electronic part, and a ridge uprightly extending from the outer edge of the support surface. The molded body of the electronic part accommodated in the storage section is held between the support surfaces of the ribs and the cover film, and is secured in a lateral direction between the ridges of the opposed ribs. Another carrier tape having a similar structure is also disclosed in Japanese Examined Patent Publication (Kokoku) No. 7-23172.

In the above-described conventional carriers for electronic parts, the storage sections are generally formed as recesses, in a plastic sheet material having a uniform thickness, through a vacuum forming process or a compression molding process. Accordingly, the relatively thinner plastic sheet material may result in the reduced thickness of the walls of the storage sections formed as recesses and thus in an insufficient mechanical strength thereof. Particularly, in the case of carrier tape, if the storage sections of the carrier tape have the thinner walls and lack in the mechanical strength of the walls, the walls, or especially the bottom walls, of the storage sections may be compressed and deformed by the underlying portion, or especially the bent connecting section, of the carrier tape rolled on a reel. The deformation of the walls of the storage sections may cause the accommodated electronic parts, or particularly the leads thereof, to be damaged.

The problem of the insufficient mechanical strength of the walls of the storage sections may become significant when the dimension of the electronic part to be accommodated is increased. In the case of forming the storage sections by a vacuum forming or a compression molding process, if the dimensions of the storage sections are enlarged so as to correspond to the dimension of the electronic parts, the rate of reduction of the thickness of the storage section walls relative to the thickness of the plastic sheet material rises. However, it is not desirable to merely increase the thickness of the plastic sheet material in order to thicken the storage section walls, because the entire stiffness of the molded carrier tape would be unnecessarily enhanced and thereby the operability for rolling the carrier tape onto the reel would be deteriorated. Therefore, for the electric part having relatively large dimension with, e.g., every side being 2 to 3 cm or more, the tray has been conventionally used, instead of the carrier tape, regardless of the reduction of an automatic mounting speed.

Also, the carrier for electronic parts is normally made as a disposable member because of the requirement of avoiding dust accumulation, and is disposed of in the form of small pieces cut by, e.g., a cutter after using the carrier or after removing the electronic parts. Accordingly, if the thickness of the plastic sheet material is merely increased in order to improve the strength of the storage section walls, the entire stiffness of the carrier would be unnecessarily enhanced, which causes a disadvantage that the cutter is worn away in a cutting process in a relatively short time. This may be caused in the case of the tray and of the carrier tape.

The applicant of the present application has proposed, in a specification of copending earlier Japanese patent application No. 9-83769 (filed on Apr. 2, 1997), a method of manufacturing a carrier tape wherein an injection molding process is adopted instead of the vacuum forming or compression molding process. The injection molding process enables the thicker walls of storage sections and the thinner connecting sections to be simultaneously integrally molded, so that the mechanical strength of the storage section walls can be improved without unnecessarily enhancing the entire stiffness of the carrier tape. However, in this solution, first a plurality of carrier pieces, each of which includes at least one storage section, are formed through the injection molding process, and then the molded carrier pieces are connected together into a tape-form to produce the carrier tape. Consequently, it is required to prevent connecting areas between the adjacent carrier pieces from being broken due to an external force such as bending or stretching force applied thereto upon rolling the carrier tape onto a reel or upon unrolling the carrier tape from the reel by an automatic mounting machine.

SUMMARY OF THE INVENTION

It is, therefore, an object of the present invention to provide a carrier for electronic parts, which can improve the mechanical strength of the walls of storage sections without unnecessarily enhancing the entire stiffness of the carrier and, thus, can be effectively used for relatively large electronic parts.

It is another object of the present invention to provide a method for manufacturing a carrier for electronic parts, which can improve the strength of connecting areas between the adjacent carrier pieces molded through an injection molding process and, thus, can prevent the connecting areas from being broken due to an external force.

It is further object of the present invention to provide a packed article with high reliability, the packed article including a plurality of electronic parts and a carrier for packing the electronic parts.

It is yet further object of the present invention to provide a method for transporting electronic parts with high reliability by using a carrier for packing the electronic parts.

In order to accomplish the above objects, the present invention provides a carrier, for electronic parts, comprising a plurality of storage sections for individually accommodating electronic parts, each of the storage sections including a bottom wall and a side wall for defining a recess; a support section provided in each of the storage sections for supporting an electronic part accommodated in each storage section, the support section including at least one rib extending along a predetermined profile on the bottom wall and a plurality of projections projecting from the bottom wall to a height generally identical to each other and lower than a height of the rib; and a plurality of connecting sections for connecting the storage sections with each other; wherein the bottom wall includes a first surface for defining a first region of the recess between the side wall and the rib and a second surface for defining a second region of the recess adjacent to the rib, the first region being deeper than the second region; wherein the projections are arranged in a distributed manner on the second surface, and the bottom wall is locally thickened at positions corresponding to the projections.

It is preferred that the bottom wall of each storage section is provided on a reverse side of the recess with a generally flat back surface located opposite to the second surface.

It is also preferred that the bottom wall of each storage section is provided on a reverse side of the recess with a depressed back surface located opposite to the second surface, the back surface being depressed relative to a back surface located opposite to the first surface.

The support section may include one rib continuously extending along a predetermined profile on the bottom wall, the one rib surrounding the second surface and being surrounded by the first surface.

It is advantageous that at least one mark is provided on the first surface of the bottom wall of each storage section for acting as a positional reference for the electronic part accommodated in the recess.

It is also advantageous that at least one mark is provided on a surface of a circumferential portion adjacent to each storage section for acting as a positional reference for the electronic part accommodated in the recess.

The present invention also provides a carrier for electronic parts, comprising a plurality of storage sections for individually accommodating electronic parts, each of the storage sections including a bottom wall; and at least one mark provided on a surface of the bottom wall for acting as a positional reference for an electronic part accommodated in each of the storage sections.

The present invention further provides a carrier for electronic parts, comprising a plurality of storage sections for individually accommodating electronic parts, each of the storage sections being recessed from an upper surface of the carrier; and at least one mark provided on the upper surface for acting as a positional reference for an electronic part accommodated in each of the storage sections.

The present invention yet further provides a method for manufacturing a carrier for electronic parts, the carrier including a plurality of storage sections arranged in a line for individually accommodating electronic parts, comprising the steps of integrally molding a plurality of carrier pieces through an injection molding process, each of the carrier pieces including at least one storage section and at least one connecting element extending from the storage section, the connecting element having a distal edge with a reduced thickness; and fixedly joining the distal edge of the connecting element of one of the carrier pieces to the distal edge of the connecting element of another one of the carrier pieces so as to construct a lamination, and thereby forming a connecting section with a generally uniform thickness for connecting the carrier pieces with each other.

In this method, the distal edge of the connecting element of each of the carrier pieces may be provided with a stepped joint face.

The present invention also provides a packed article comprising a carrier as defined in claim 1; and a plurality of electronic parts individually accommodated in the storage sections of the carrier.

The present invention further provides a method for transporting electronic parts, comprising the steps of providing a carrier as defined in claim 1; individually inserting electronic parts into the storage sections of the carrier; and transporting the carrier.

BRIEF DESCRIPTION OF THE DRAWINGS

The above and other objects, features and advantages of the present invention will become more apparent from the following description of preferred embodiments in connection with the accompanying drawings, in which.

DETAILED DESCRIPTION OF THE PREFERRED EMBODIMENTS

Figure 3:
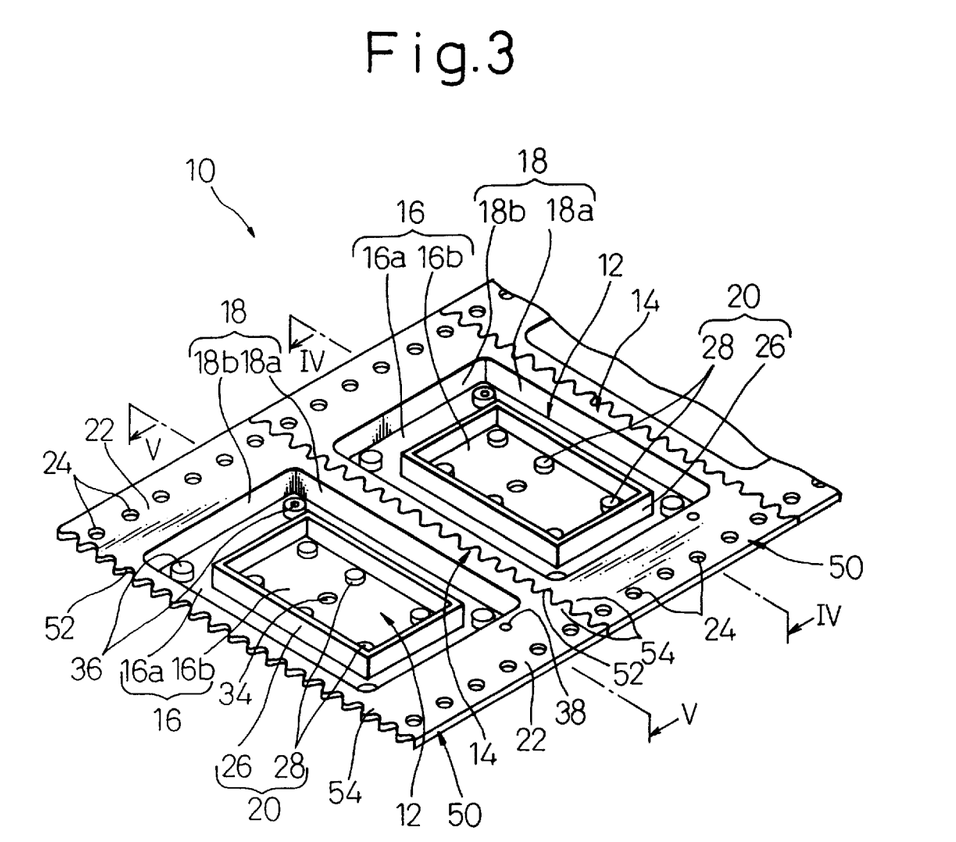
FIG. 3 is an enlarged perspective view showing a part of a carrier for electronic parts, according to a first embodiment of the present invention.
Figure 4:
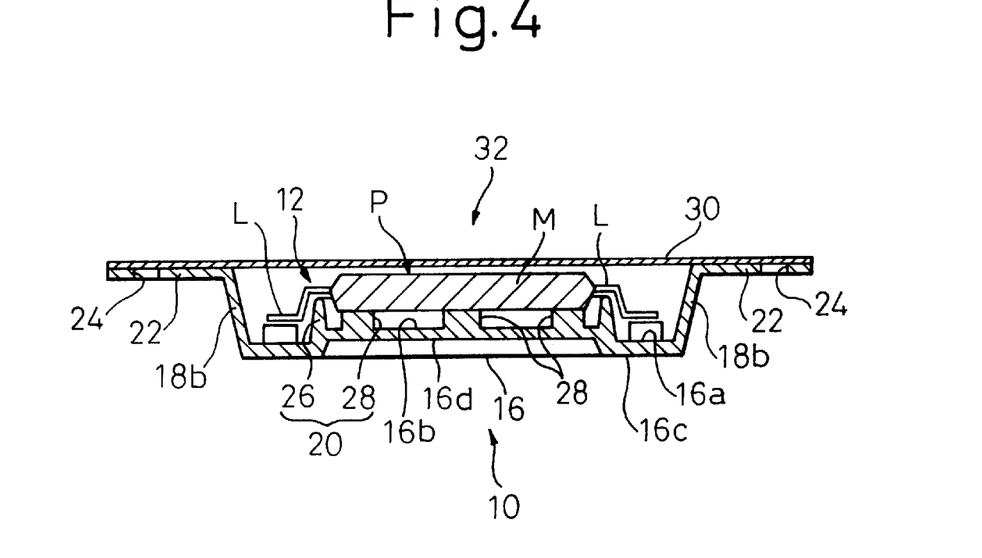
FIG. 4 is a sectional view of a packed article of electronic parts, structured by using the carrier shown in FIG. 3, taken along a line IV—IV of FIG. 3.
Figure 5:
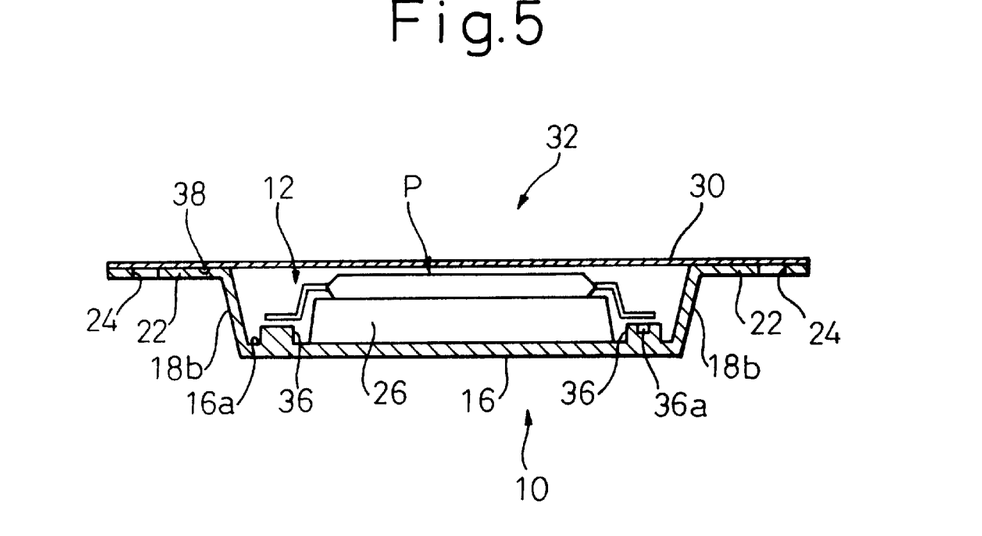
FIG. 5 is a sectional view of a packed article of electronic parts, structured by using the carrier shown in FIG. 3, taken along a line V—V of FIG. 3.

Referring now to the drawings, wherein the same or similar components are designated by the common reference numerals, FIG. 3 shows a part of a carrier 10, for electronic parts, according to a first embodiment of the present invention; FIG. 4 shows one part of the carrier 10 and an electronic part P accommodated therein; and FIG. 5 shows another part of the carrier 10 and the electronic part P.

The carrier 10 includes a plurality of storage sections 12 defining recesses for individually accommodating electronic parts P and a plurality of connecting sections 14 for connecting the adjacent storage sections 12 with each other. The storage sections 12 are regularly arranged in a line with the connecting sections 14 being interposed therebetween, and thus the carrier 10 is constructed as a carrier tape.

Each of the storage sections 12 is provided with a bottom wall 16 and a side wall 18 for defining a recess having a generally rectangular shape in a plan view, and a support section 20 projecting from the bottom wall into the recess for supporting the electronic part P. In the illustrated embodiment, the storage sections 12 have shapes and dimensions identical to one another, and are linearly arranged in such a manner that longer side-wall areas 18a located at longer sides of the rectangular shape thereof are disposed parallel to one another and shorter side-wall areas 18b located at shorter sides of the rectangular shape thereof are aligned along common lines.

Each of the connecting sections 14 extends generally parallel to the bottom wall 16 of each storage section 12 to connect the top edges of the adjacent longer side-wall areas 18a of the storage sections 12 disposed side-by-side. The opposite ends of the carrier 10, extending longitudinally along the array of the storage sections 12, are formed as tape edge sections 22 extending generally parallel to the bottom wall 16 and adjacent to the top edges of the shorter side-wall areas 18b of the storage sections 12. Accordingly, each storage section 12 is shaped as a recess having a predetermined depth from the upper surfaces of the connecting sections 14 and the tape edge sections 22. Each of the tape edge sections 22 is provided with a number of through holes 24 arranged at regular intervals along the array of the storage sections 12. The through holes 24 act as sprocket holes with which teeth of tape feeding sprockets incorporated in an automatic mounting machine, described later, are engaged.

The support section 20 of each storage section 12 includes one rib 26 continuously extending on the bottom wall 16 along a generally rectangular profile in a plan view, and a plurality of columnar projections 28 projecting from the bottom wall 16 to a height generally identical to one another and lower than a height of the rib 26. The rib 26 is an annular wall-shaped projection extending generally parallel to the side wall 18 of the storage section 12, and functionally divides the recess as the storage section 12 into a first outer region defined between the side wall 18 and the rib 26, and a second inner region defined inside the rib 26.

More specifically, the bottom wall 16 of each storage section 12 includes a first surface 16a extending between the side wall 18 and the rib 26 to define a first deeper region of the recess, and a second surface 16b extend inside the rib 26 to define a second region of the recess shallower than the first region. Consequently, the rib 26 extends to surround the second surface 16b of the bottom wall 16 and to be surrounded by the first surface 16a of the bottom wall 16. Then, the columnar projections 28 are arranged in a distributed manner on the second surface 16b of the bottom wall 16. In the illustrated embodiment, six columnar projections 28 are regularly arranged in such a manner that each three of them are located at regular intervals near the respective sides of the rib 26 opposite to the longer side-wall areas 18a of each storage section 12.

The carrier 10 has an advantageous construction in which the bottom wall 16 of each storage section 12 is locally thickened at portions corresponding to the rib 26 and the columnar projections 28 (FIG. 4). On the other hand, the bottom wall 16 and the side wall 18, constructing each storage section 12, have a generally uniform thickness, except for the locally thickened portions at the rib 26 and the columnar projections 28. More specifically, the bottom wall 16 of each storage section 12 has, in the reverse side of the recesses of the carrier 10, a generally flat back surface 16d located opposite to the second surface 16b, so that the locally thickened solid portions are provided at the portions of the rib 26 and the columnar projections 28.

The carrier 10 having the above-mentioned structure can be suitably used for an electronic part P especially called a quad flat package (QFP) which includes a number of gull-wing leads L extending from four sides of a generally rectangular plate-like molded body M. After inserting the electronic parts P into the storage sections 12 of the carrier 10, a transparent or translucent cover film 30 (FIG. 4) is removably attached to the upper surface of the carrier 10, or the upper surfaces of the connecting sections 14 and the tape edge sections 22, so as to constitute a packed article 32 of electronic parts.

In the packed article 32 of electronic parts, the molded body M of the electronic part P is received in the shallower second region of the recess of the storage section 12 and is stably and securely supported on the columnar projections 28 of the support section 20. In this location, the lower portions of the four sides of the molded body M are surrounded by the rib 26 of the support section 20, whereby the electronic part P is substantially prevented from laterally shifting in the storage section 12. On the other hand, the leads L of the electronic part P are received in the deeper first region of the recess of the storage section 12 without coming into contact with the bottom and side walls 16, 18, so as not to be subjected to significant impact from the outside of the carrier 10. Also, the electronic part P is substantially prevented from vertically shifting in the storage section 12 by the cover film 30 attached to the upper surface of the carrier 10.

Figure 6:
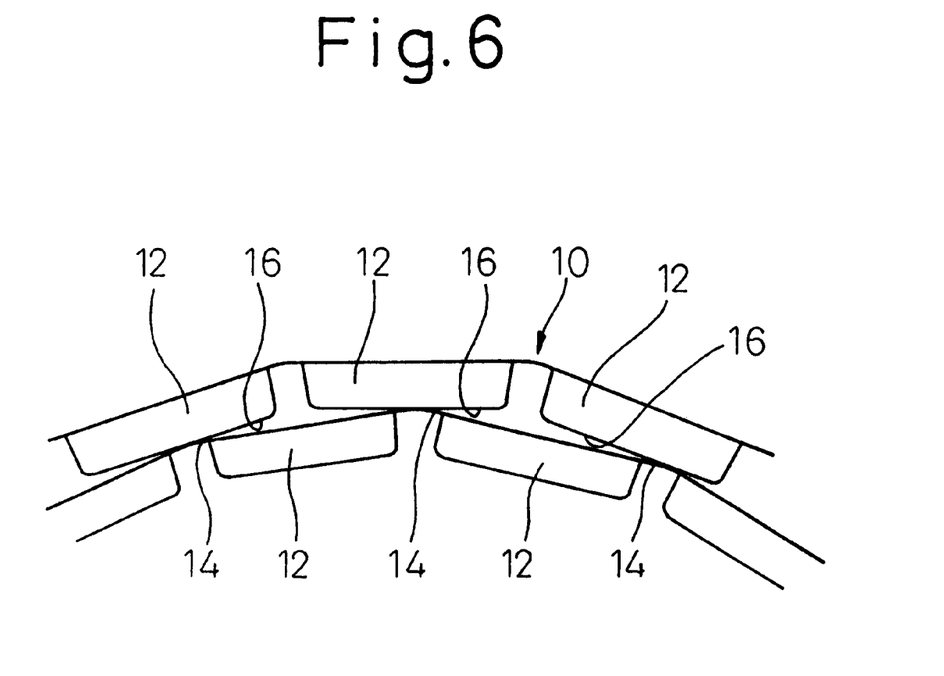
FIG. 6 is a schematic front view of the carrier of FIG. 3 in a state of being rolled on a reel.

According to the carrier 10, the rib 26 formed on the bottom wall 16 of each storage section 12 as well as the columnar projections 28 distributed on the second surface 16b act to locally increase the thickness of the bottom wall 16 at their positions, and thereby the mechanical strength of the bottom wall 16 is effectively improved. Consequently, even when the bent connecting sections 14 are located beneath or inside the storage sections 12 in the carrier 10 rolled onto a reel (see FIG. 6), the bottom wall 16 of each storage section 12 can maintain the original shape thereof without deformation, whereby the accommodated electronic part P can be effectively protected from damage.

In order to form the bottom walls 16 having the locally thickened portions, it is advantageous to manufacture the carrier 10 through an injection molding process, as disclosed in a specification of copending earlier Japanese patent application No. 9-83769. According to the injection molding process, the above-described structure in which the bottom wall 16 is reinforced by the rib 26 and the columnar projections 28 can be easily obtained. Particularly, even for the electric part having relatively large dimension with, e.g., every side being 2 to 3 cm or more, it is possible to provide sufficient strength for the bottom wall 16 by appropriately adjusting the number of the columnar projections 28 and the height thereof from the second surface 16b in the molding process. Further, the connecting sections 14 can be formed relatively thin so as not to deteriorate the flexibility thereof, whereby it is possible to maintain the operability for rolling the carrier 10 onto a reel, without unnecessarily enhancing the entire stiffness of the carrier 10.

It is advantageous for each storage section 12 to adjust the positions of the columnar projections 28 on the second surface 16b of the bottom wall 16 in such a manner that a cutter edge provided in an automatic mounting machine described later for cutting the carrier 10 after taking out the electronic part P or after using the carrier 10 can pass by or avoid the columnar projections 28. Consequently, the cutter edge can cut the relatively thin portions in the bottom walls, which results in the effective extension of the life of the cutter edge.

Figure 7:
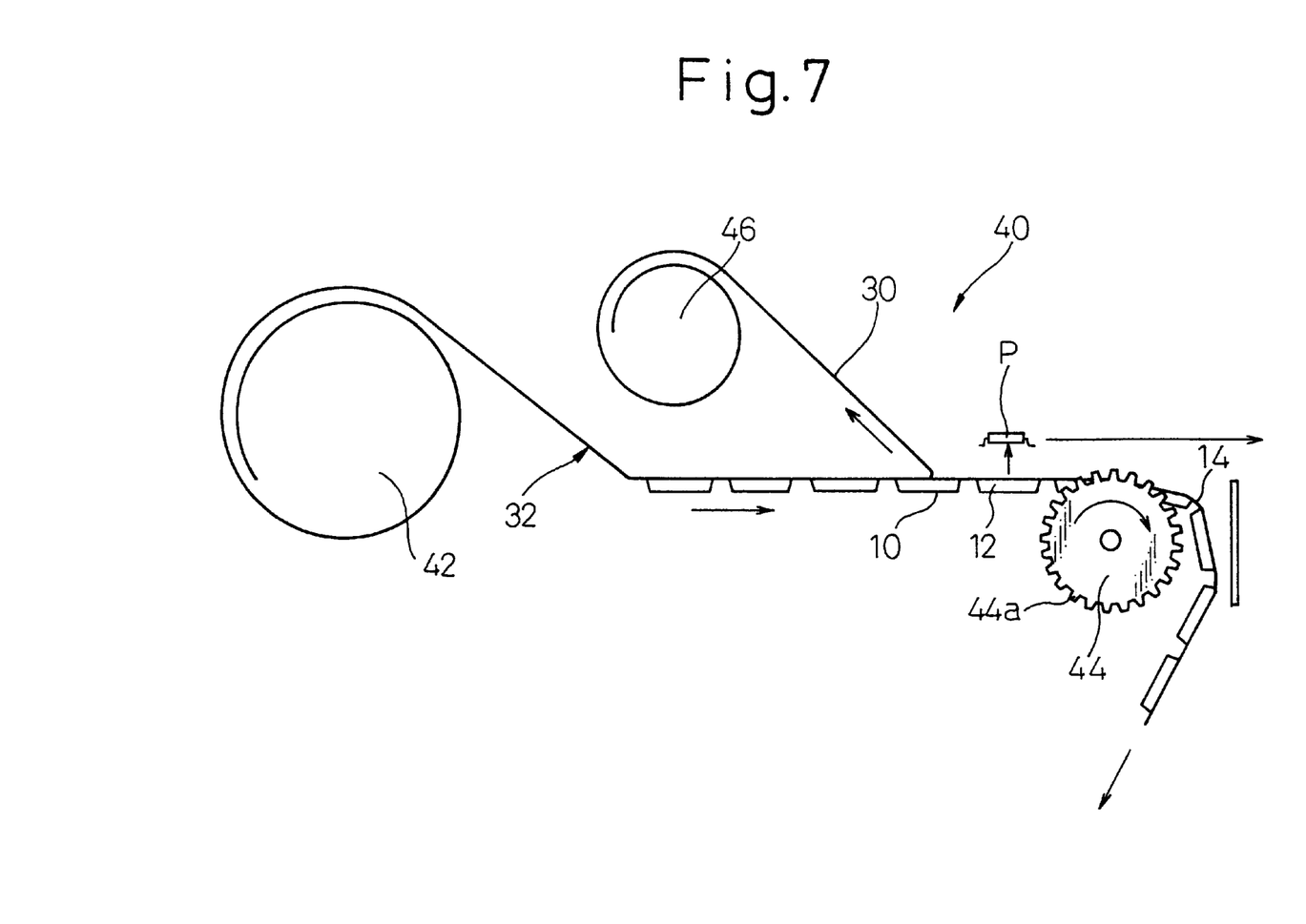
FIG. 7 is a diagrammatic front view of an automatic mounting machine which can be used for a packed article of electronic parts, structured by using the carrier shown in FIG. 3.

FIG. 7 diagrammatically shows one example of an automatic mounting machine 40 into which the carrier 10 is incorporated. The carrier 10 is rolled in the form of the packed article 32 of electronic parts onto a reel 42, and is incorporated in this state in the automatic mounting machine 40. The leading end portion of the carrier 10, partially unrolled from the reel 42, is engaged at the through holes 24 (FIG. 3) formed in the tape edge portions 22 thereof with teeth 44a of a sprocket 44 provided in a tape feed-drive section of the automatic mounting machine 40. An electronic part take-out station is provided upstream of the sprocket 44, and the cover film 30 is removed or stripped from the carrier 10 at a location upstream of the take-out station and then is rolled on another reel 46.

When the sprocket 44 is actuated, the carrier 10 is intermittently unrolled from the reel 42, the cover film 30 is gradually removed from the carrier 10, and the electronic parts P accommodated in the storage sections 12 are sequentially fed into the electronic part take-out station. Then, each electronic part P is taken out from the corresponding storage section 12 by, e.g., a robot hand (not shown), and thereafter is mounted on a circuit board (not shown) by the robot hand. After taking out the electronic parts P, the carrier 10 is fed and turned downward to a location under the sprocket 44, and then is cut into small pieces by a cutter edge (not shown).

In the case of manufacturing the carrier 10 through an injection molding process, first a plurality of carrier pieces 50 (FIG. 3), each of which includes at least one storage section 12, are formed through the injection molding process, and then the molded carrier pieces 50 are connected together into a tape-form to produce the carrier tape. FIG. 3 shows an embodiment wherein the carrier pieces 50, each of which includes one storage section 12, are connected together through wavy joint faces 52 formed in the connecting sections 14. In this structure, it is required to prevent the connecting sections 14 from being broken due to stress concentration into the joint faces 52 joining the carrier pieces 50, which may result from a stretching force applied to the carrier 10 upon unrolling the carrier 10 from the reel 42 by the automatic mounting machine 40, or from a bending force applied to the carrier 10 upon turning the carrier 10 downward at the sprocket 44. To this end, the present invention adopts a characteristic manufacturing process described below.

Figure 8A:
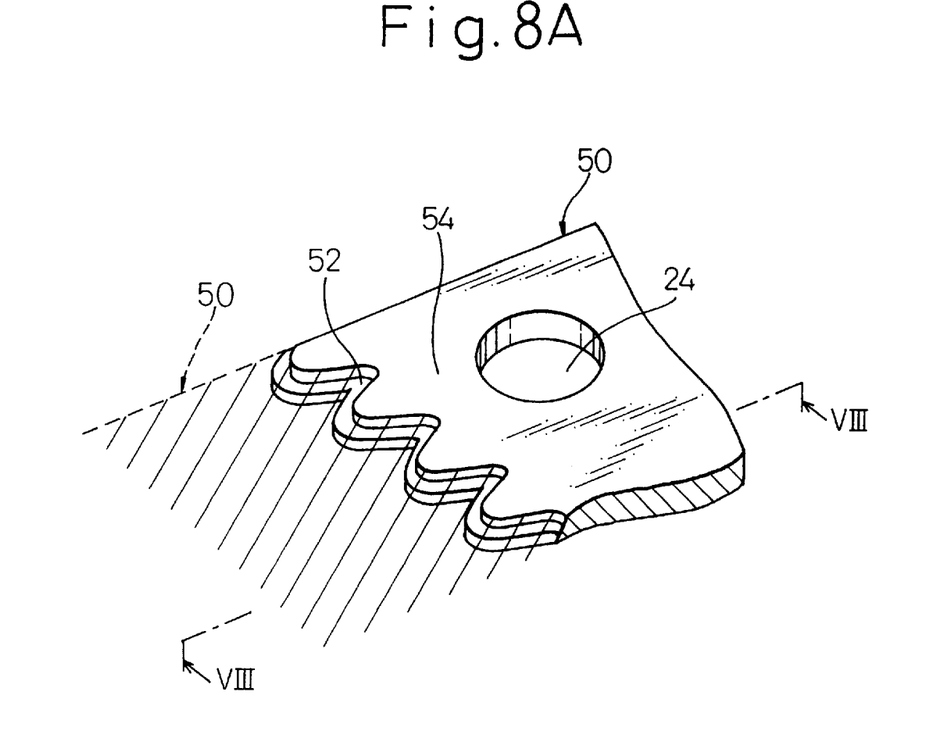
FIG. 8A is an enlarged perspective view showing a part of the carrier shown in FIG. 3.

With regard to the carrier 10 shown in FIG. 3, in a first step of the manufacturing process, a carrier piece 50 including one storage section 12 and a pair of connecting elements 54 is integrally molded in a predetermined mold (not shown) through the injection molding process, each connecting element 54 extending parallel to the bottom wall 16 from the top ends of opposed longer side-wall areas 18a of the storage section 12 and having a distal edge with a reduced thickness. During this step, portions including through holes 24, which correspond to the tape edge sections 22 of the carrier 10, are simultaneously integrally molded. Also, the joint face 52 extending wavily and having a stepped thickness configuration is formed at the distal edge of each connecting element 54 of the carrier piece 50, as shown in, e.g., FIG. 8A.

Figure 8B:
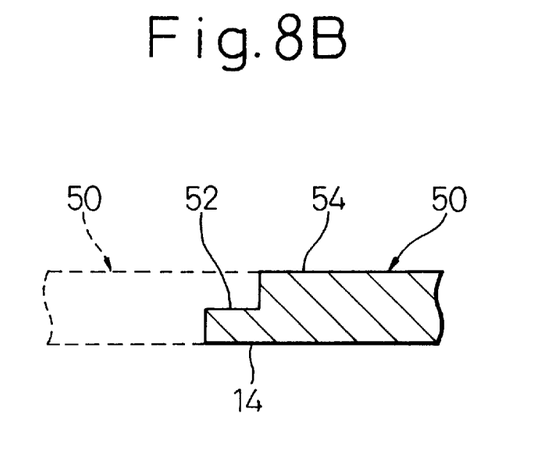
FIG. 8B is a sectional view of the carrier shown in FIG. 3, taken along a line VIII—VIII of FIG. 8A.

A plurality of carrier pieces 50, each having the above structure, are formed through the injection molding process, and thereafter, the joint faces 52 of the connecting elements 54 of respective two carrier pieces 50 are fixedly joined together so as to construct a lamination, as shown in FIG. 8B. In this manner, the connecting sections 14 are formed with generally uniform thicknesses, and the carrier 10 is produced in which the carrier pieces 50 are connected together through the connecting sections 14.

In order to fixedly join together the joint faces 52 of the connecting elements 54 of the carrier pieces 50, various fixing method can be adopted, such as an adhesion process by an adhesive or an ultrasonic welding process. However, as a manufacturing process of the carrier 10, it is advantageous to progressively weld together the joint faces 52 while the carrier pieces 50 are molded one-by-one in the mold. In this process, the molding cavity of the mold is provided with an opening at a position corresponding to the joint face 52 of one of the connecting elements 54. When a first carrier piece 50 should be molded, the injection molding process is carried out in the condition where this opening is temporarily closed by an outside auxiliary mold. The stepped joint face 52 is formed only in the other connecting element 54 of the first carrier piece 50. Then, the first carrier piece 50 is removed from the mold, and the stepped joint face 52 of the other connecting element 54 thereof is inserted into the opening of the mold to close it. In this condition, a next or second carrier piece 50 is molded through the injection molding process. During this step, the joint face 52 of the connecting element 54 of the first carrier piece 50 is temporarily molten and then is fixedly welded to the connecting element 54 of the second carrier piece 50. When these steps are repeated, the carrier 10 is manufactured and the carrier pieces 50 are fixedly connected together into a tape form.

According to the above manufacturing process, the joint faces 52 of the carrier pieces 50 are fixedly joined with each other through sufficient joint surface areas so as to form a lamination, and thereby secure and firm joints are established, which can resist an external force, such as bending or stretching force applied to the connecting sections 14 of the carrier 10. Consequently, the carrier 10 can be surely prevented from being broken at the connecting sections 14 when the carrier 10 is rolled onto the reel 42 or when the carrier 10 is unrolled from the reel 42 by the automatic mounting machine 40.

Figure 9A:
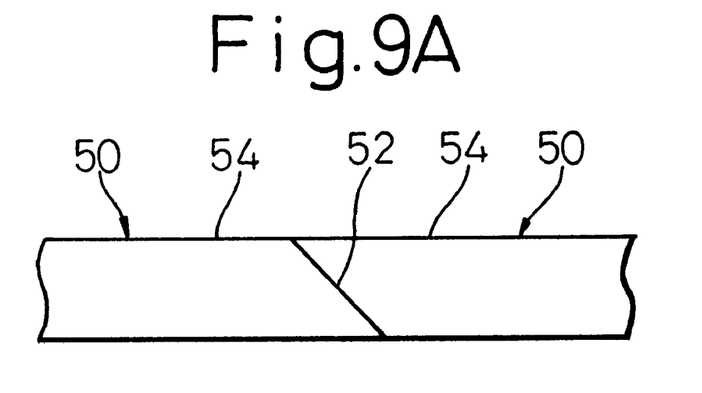
FIGS. 9A to 9C are schematic illustrations of modifications of a connecting section of the carrier.
Figure 9B:
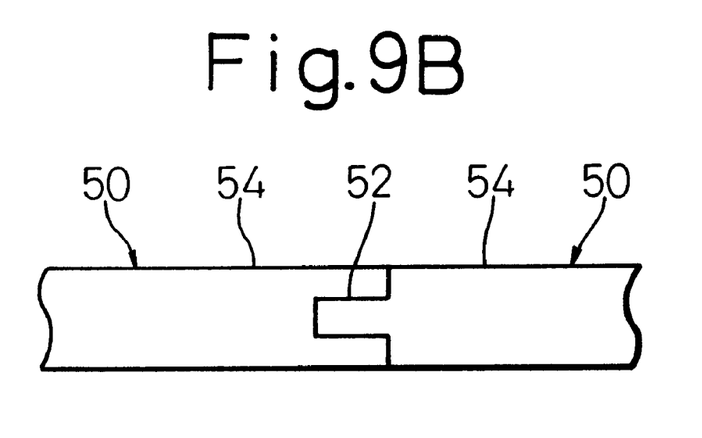
Figure 9C:
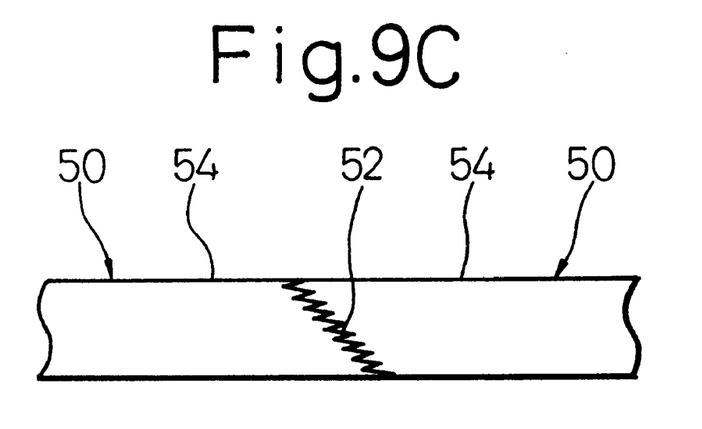

In the above manufacturing process, the joint face 52 of the connecting element 54 of the carrier piece 50 can also be provided with various shapes instead of the stepped shape described above. For example, a slant joint face 52 (FIG. 9A), a tongue or groove joint face 52 (FIG. 9B) or a saw-tooth joint face 52 (FIG. 9C) can be adopted in correspondence with a joint strength to be required.

When the carrier 10 is manufactured through the above-described injection molding process, it is advantageous that a gate for molten resin is provided at a position corresponding to the back surface 16d of the bottom wall 16 of the storage section 12 of each carrier piece 50. In this arrangement, the mold of the carrier piece 50 is preferably structured in such a manner that the gate for molten resin is located in correspondence with one of the columnar projections 28 formed on the second surface 16b of the bottom wall 16, and thereby the flowability of the molten resin from the gate to a molding cavity can be effectively improved.

If the gate is provided at a position corresponding to the back surface 16d of the bottom wall 16 of the storage section 12 as described above, the back surface 16d of the bottom wall 16 is liable to form a bur in correspondence with the gate after the injection molding. Such a bur may cause a damage on the cover film 30 underlying the storage section 12 when, e.g., the carrier 10 is rolled on the reel 42. Thus, in the carrier 10, the back surface 16d of the bottom wall 16 of each storage section 12 is formed to be depressed from a back surface 16c opposite to the first surface 16a in the reverse side of the recesses of the carrier 10 (FIG. 4). If the gate is located in correspondence with such a depressed back surface 16d of the bottom wall 16, formed in the reverse side of the carrier 10, the disadvantage due to the bur can be effectively eliminated.

Incidentally, a manufacturer of electronic parts usually checks whether the electronic parts P are actually accommodated in the respective storage sections 12 of the carrier 10 by using an image recognition system such as a charge coupled device (CCD). Accordingly, the carrier 10 may be provided at a generally center of the bottom wall 16 of each storage section 12 with a through hole 34 for an image recognition (FIG. 3). It is also required that, when the electronic parts P are accommodated in the respective storage sections 12 of the carrier 10, each electronic part P is correctly located at a predetermined position in the storage section 12 in order to smoothly carry out the automatic mounting process by the automatic mounting machine. To this end, the carrier 10 may also be provided on the first surface 16a of the bottom wall 16 of each storage section 12 with a mark 36 which acts as a positional reference of the accommodated electronic part P, in order to check whether the electronic part P is precisely located in the storage section 12. The embodiment shown in FIGS. 3 to 5 includes the marks 36 structured as second columnar projections formed at four corners on the first surface 16a of the bottom wall 16.

When the marks 36, acting as the positional reference, as well as the electronic part P accommodated in the storage section 12, are picked up or sensed by the CCD from the upside of the carrier 10, in the same manner as the image recognition of the through hole 34, it is possible to detect the positional error or misalignment of the electronic part P relative to the marks 36, and also to check whether the positional error lies within a predetermined tolerance. Accordingly, it is required for the marks 36 to be formed at positions not concealed by the electronic part P when the storage section 12 is seen from the upside thereof. Also, a dimple 36a (FIG. 5) may be formed on the top face of the mark 36 so as to improve an image recognition function. Alternatively, the mark 36 may be formed as a bore penetrating through the bottom wall 16.

In addition to or instead of the marks 36, a mark or marks 38 may also be provided, as a positional reference of the electronic part P accommodated in the recess, on the surface of the circumferential portion adjacent to each storage section 12 of the carrier 10. The embodiment shown in FIGS. 3 to 5 includes the marks 38 structured as dimples formed on the upper surface of one tape edge section 22 near the respective storage sections 12. In this arrangement, it is an advantage that the inner surface of each mark 38 has a hemispherical shape, from the viewpoint of improving the image recognition function. The marks 36, 38 structured as projections, bores, dimples, etc. can be readily formed through the injection molding process described above.

Figure 10:
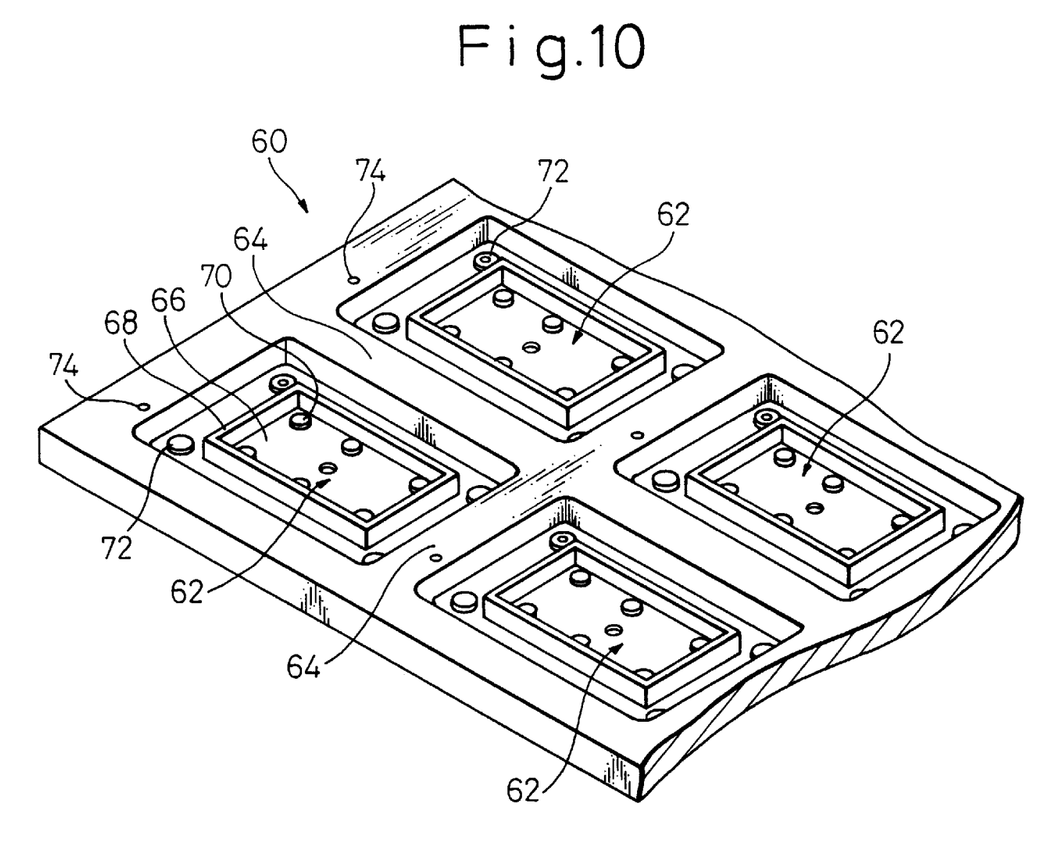
FIG. 10 is an enlarged perspective view showing a part of a carrier for electronic parts, according to a second embodiment of the present invention.

FIG. 10 shows a part of a carrier 60 for electronic parts, according to a second embodiment of the present invention. The carrier 60 includes a plurality of storage sections 62 defining recesses for individually accommodating electronic parts and a plurality of connecting sections 64 for connecting the adjacent storage sections 62 with one another. The storage sections 62 are regularly arranged in a matrix with the connecting sections 64 being interposed therebetween, and thus the carrier 60 is constructed as a tray.

The structures of the storage sections 62 and the connecting sections 64 substantially conform to the structures of the storage sections 12 and the connecting sections 14 of the carrier 10 shown in FIG. 3, and thus are not repeatedly described in detail. It should be noted, however, that all of the storage sections 62 and the connecting sections 64 in the carrier 60 are integrally molded in a single mold through an injection molding process. Also, it will be easily appreciated in this structure that the wall, or especially the bottom wall 66, of each storage section 66 can be reinforced by a rib 68 and a plurality of columnar projections 70 provided on the bottom wall 66 as a support section for supporting the electronic part.

Further, the carrier 60 may be provided with one or more marks 72, 74 which act as a positional reference for the electronic part accommodated in each storage section 62, in the same manner as the marks 36, 38 described in connection with the carrier 10 shown in FIG. 3.

As apparent from the above description, the carrier for electronic parts, according to the present invention, can effectively improve the mechanical strength of the walls of the storage sections without unnecessarily enhancing the entire stiffness of the carrier, and thus can prevent the accommodated electronic parts from being damaged. Even when relatively large electronic parts must be accommodated in the carrier having a tape form, the mechanical strength of the storage sections can be improved without deteriorating the operability for rolling the carrier onto a reel.

Also, according to the present invention, the strength of connecting areas between the adjacent carrier pieces molded through an injection molding process can be effectively improved, and thereby the connecting areas can be prevented from being broken due to an external force. Further, the reliability of a packed article including a plurality of electronic parts and of a method for transporting electronic parts can be improved by using the carrier according to the present invention.

While the invention has been particularly shown and described with reference to preferred embodiments thereof, it will be understood by those skilled in the art that various changes and modifications may be made without departing from the spirit and scope of the invention. For example, a single carrier for electronic parts may include a plurality of storage sections having different shapes and dimensions from one another. The rib in each storage section may have various structures, such as a pair of opposite rails, other than the continuously extending rectangular wall as illustrated, in correspondence with the shape of the molded body of the electronic part to be accommodated. The projections constituting the support section may have various shapes, such as a cylinder, a prism, a cone, a truncated cone, etc., and may have various dimensions, numbers, arrangements in correspondence with a reinforcing function to be required. The scope of the invention is therefore to be determined solely by the appended claims.

What is claimed is:

1. A carrier for electronic parts, comprising:
   a plurality of storage sections individually accommodating electronic parts, each of said storage sections including a bottom wall and a side wall defining a recess;
   a support section, in each of said storage sections, supporting an electronic part accommodated in said each storage section, said support section including at least one rib extending along a predetermined profile on said bottom wall and a plurality of projections projecting from said bottom wall to a generally common height lower than a height of said rib;
   a plurality of connecting sections connecting said storage sections with each other;
   said bottom wall comprising a first surface defining a first region of said recess between said side wall and said rib and a second surface defining a second region of said recess adjacent to said rib, said first region being deeper than said second region; and
   said projections being arranged in a distributed manner on said second surface and said bottom wall being locally thickened at portions corresponding to said projections.

2. The carrier of claim 1, wherein said bottom wall of each storage section is provided on a reverse side of said recess with a generally flat back surface located opposite to said second surface.

3. The carrier of claim 1, wherein said bottom wall of each storage section is provided on a reverse side of said recess with a depressed back surface located opposite to said second surface, said back surface being depressed relative to a back surface located opposite to said first surface.

4. The carrier of claim 1, wherein said support section further comprises a rib continuously extending along a predetermined profile on said bottom wall, said rib surrounding said second surface and being surrounded by said first surface.

5. The carrier of claim 1, further comprising at least one mark, on said first surface of said bottom wall of each storage section acting as a positional reference for the electronic part accommodated in said recess.

6. The carrier of claim 1, further comprising at least one mark, on a surface of a circumferential portion adjacent to each storage section, acting as a positional reference for the electronic part accommodated in said recess.

7. A packed article, comprising:
   a carrier as defined in claim 1; and
   a plurality of electronic parts individually accommodated in said storage sections of said carrier.

8. A method for transporting electronic parts, comprising:
   providing a carrier as defined in claim 1;
   individually inserting electronic parts into said storage sections of said carrier; and
   transporting said carrier.

\* \* \* \* \*

UNITED STATES PATENT AND TRADEMARK OFFICE
CERTIFICATE OF CORRECTION

PATENT NO. : 6,149,010
DATED : November 21, 2000
INVENTOR(S) : Katsuhiko TANAKA

It is certified that error appears in the above-indentified patent and that said Letters Patent is hereby corrected as shown below:

On the title page, [73] Assignees, change "Takamisa" to --Takamisawa--.

Signed and Sealed this

Tenth Day of April, 2001

Attest:

NICHOLAS P. GODICI

Attesting Officer     Acting Director of the United States Patent and Trademark Office